(12) United States Patent
Depetro et al.

(10) Patent No.: US 6,184,716 B1
(45) Date of Patent: Feb. 6, 2001

(54) HIGH VOLTAGE OUTPUT STAGE FOR DRIVING AN ELECTRIC LOAD

(75) Inventors: Riccardo Depetro, Domodossola; Fabrizio Martignoni, Morazzone; Enrico Scian, Cordenons, all of (IT)

(73) Assignee: STMicroelectronics S.r.l., Agrate Brianza (IT)

(*) Notice: Under 35 U.S.C. 154(b), the term of this patent shall be extended for 0 days.

(21) Appl. No.: 09/183,975

(22) Filed: Oct. 30, 1998

(30) Foreign Application Priority Data

Oct. 31, 1997 (EP) .................................................. 97830559

(51) Int. Cl.[7] .............................................. H03K 19/0175
(52) U.S. Cl. .................................. 326/83; 326/68; 326/81
(58) Field of Search .................................. 326/68, 80, 81, 326/83, 31, 34

(56) References Cited

U.S. PATENT DOCUMENTS

| | | | |
|---|---|---|---|
| 5,128,555 | 7/1992 | Millman | 307/443 |
| 5,142,244 | 8/1992 | Glica et al. | 330/253 |
| 5,583,454 | * 12/1996 | Hawkins et al. | 326/81 |
| 5,815,013 | * 9/1998 | Johnston | 327/112 |

* cited by examiner

Primary Examiner—Michael Tokar
Assistant Examiner—Anh Tran
(74) Attorney, Agent, or Firm—Theodore E. Galanthay; Robert Iannucci; Seed Intellectual Property Law Group PLLC

(57) ABSTRACT

The invention relates to a high-voltage final output stage for driving an electric load, of the type which comprises a complementary pair of transistors connected between first and second supply voltage references, and at least one PMOS pull-up transistor connected in series with an NMOS pull-down transistor. The stage comprises an additional PMOS transistor connected in parallel with the pull-up transistor and having the body terminal in common therewith. More particularly, the body terminals of both PMOS transistors are formed in the semiconductor within a common well which can withstand high voltages, and the additional transistor is a thick oxide PMOS power transistor.

20 Claims, 2 Drawing Sheets

HIGH VOLTAGE OUTPUT STAGE FOR DRIVING AN ELECTRIC LOAD

TECHNICAL FIELD

This invention relates to a high-voltage final output stage for driving an electric load.

More particularly, the invention relates to a high-voltage final output stage for driving an electric load, of the type which comprises a complementary pair of transistors connected between first and second supply voltage references, and including at least one PMOS pull-up transistor connected in series with an NMOS pull-down transistor.

BACKGROUND OF THE INVENTION

As is well known, a final output stage of a generic electronic circuit basically includes a drive portion intended for powering a load. Thus, the output stage should be capable of draining or taking up current from the load, according to necessity and the type of application involved.

Countless configurations have been provided in the prior art for the output stage. FIG. 1 attached hereto shows schematically one of the most common such output stage configurations.

The output stage in FIG. 1 comprises a complementary pair of MOS transistors connected in series with each other, between a first voltage reference Vdd and a second voltage reference Vss, wherein the latter may either be a negative supply or a ground.

Complementary pairs of MOS transistors are mostly employed in output stages on account of the definite advantages that they afford as regards the control logics, however, the considerations made herein below would also apply to output stage configurations incorporating bipolar transistors or any other pairs of MOS transistors.

The first transistor M7 in the complementary pair is a pull-down transistor of either the NMOS or the DMOS type, and has its body terminal connected to its source terminal.

The second transistor M8 in the complementary pair is a pull-up transistor of the thin oxide PMOS type, and has its body terminal connected to its source terminal.

The transistors M8 and M7 are connected to each other through their respective drain terminals, which terminals coincide with an output node OUT. An electric load, not shown, is connected between this output node OUT and ground.

The electric load is driven alternately by the PMOS transistor M8 or the NMOS transistor M7, according to the different sourcing or of sinking operation modes.

Respective driver circuits have their respective outputs connected to the gate terminals of the transistors M8 and M7.

FIG. 1 shows, by way of example, a level shifter circuit for driving the transistors M7 and M8 of the final output stage thereby transferring an information from a low-voltage signal to a high-voltage signal. The circuit shown includes two NMOS drive transistors M1 and M2, two PMOS buffer transistors M4 and M3 effecting the voltage shift, and two additional PMOS transistors M5 and M6 forming a bistable flip-flop for storing information about the state of the power PMOS M8. The gate terminal of the output PMOS M8 is connected to one, M3, of the two PMOS buffer transistors.

A shifter circuit of this kind also requires a reference voltage, to be obtained through a few zeners, for example, for biasing the gate terminals of the MOS buffer transistors M3 and M4.

SUMMARY OF THE INVENTION

For many applications, output stages which can operate in both low-voltage and high-voltage conditions would be desirable.

However, the prior art offers no solutions which can efficiently fill the demand in terms of performance as well as of reduced occupation of circuit area.

An embodiment of this invention provides an output stage and associated level shifting driver circuit which have such respective functional and structural features as to be usable in low-driving and high-driving voltage applications and occupy a reduced circuit area.

The embodiment provides an output stage which incorporates both a thin oxide PMOS transistor and a thick oxide PMOS transistor, and has both transistors driven from the same level shifting driver circuit.

Based on this solving idea, the technical problem is solved by a final output stage as previously indicated and defined in the characterizing portion of claim 1.

Features and advantages of the circuit according to this invention will be apparent from the following description of an embodiment thereof, given by way of non-limitative example with reference to the accompanying drawings.

DETAILED DESCRIPTION OF THE INVENTION

Figure 1:
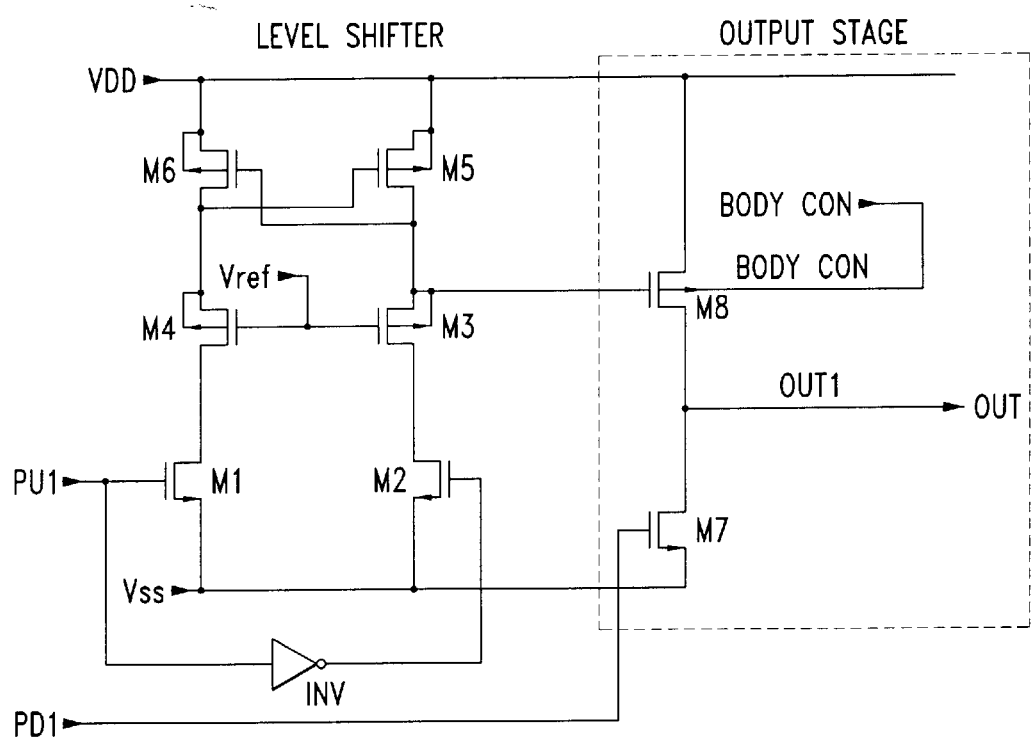
FIG. 1 is a schematic view of a final output stage according to the prior art, as driven by a respective level shifting driver circuit.
Figure 2:
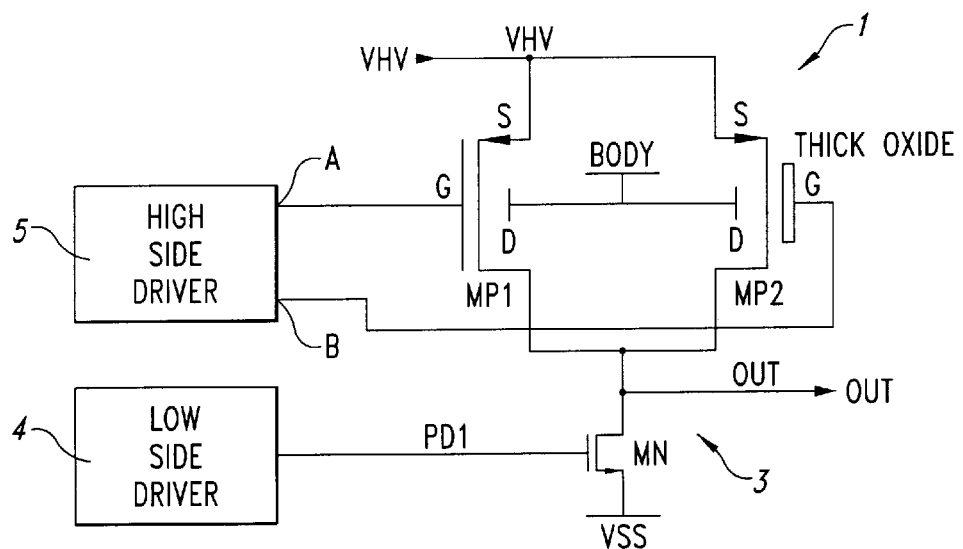
FIG. 2 is a schematic view of an output stage according to this invention.

Referring to the drawing figures, in particular to the example of FIG. 2, generally and schematically shown at 1 is a final output stage embodying this invention and adapted to drive an electric load.

The stage 1 is a power stage intended for driving an electric load connected between an output node OUT of the stage 1 and ground, for example.

The stage 1 comprises a complementary pair 3 of MOS transistors MP1, MN and a third MOS transistor MP2.

The transistors in the pair 3 are connected with each other between a first voltage reference Vdd and a second voltage reference Vss, it being possible for the latter to either be a negative supply or ground.

The first transistor MN in the complementary pair 3 is a pull-down transistor of the NMOS type having its source terminal connected to the second supply voltage reference Vss and its gate terminal arranged to receive a control signal PD1 from a low side driver circuit 4.

The second transistor MP1 in the complementary pair 3 is a pull-up transistor of the thin oxide PMOS power type. This transistor MP1 is connected in parallel with the third transistor MP2 of the PMOS type and has its source terminal connected to the first supply voltage reference Vdd, its drain terminal connected to the drain terminal of the first transistor MN and its body terminal connected to the body terminal of the third transistor MP2.

In a preferred embodiment, these body terminals can be formed in the semiconductor, inside a common well capable of withstanding high voltages.

Advantageously, this body well can be accessed through a terminal for applying a predetermined potential, defined by an electric signal BODY_CON, to the body region.

The transistors MP1 and MP2 are preferably in integrated form and connected in the semiconductor inside the same well, with also the source and drain terminals in common.

Both PMOS transistors MP1 and MP2 are connected in series with the NMOS transistor MN through their respective drain terminals coincident with the output node OUT.

Advantageously, the third transistor MP2 is a thick oxide PMOS power transistor, and has its source and drain terminals connected to the first voltage reference Vdd and the output node OUT, respectively.

The gate terminal of the second transistor MP1 is connected to a first output A of a high side driver circuit 5, and the gate terminal of the third transistor MP2 is connected to a second output B of the driver circuit 5.

The driver circuit 5 can be classed as essentially a high-voltage level shifter which transfers the logic information to both MOS switches MP1 and MP2.

Figure 4:
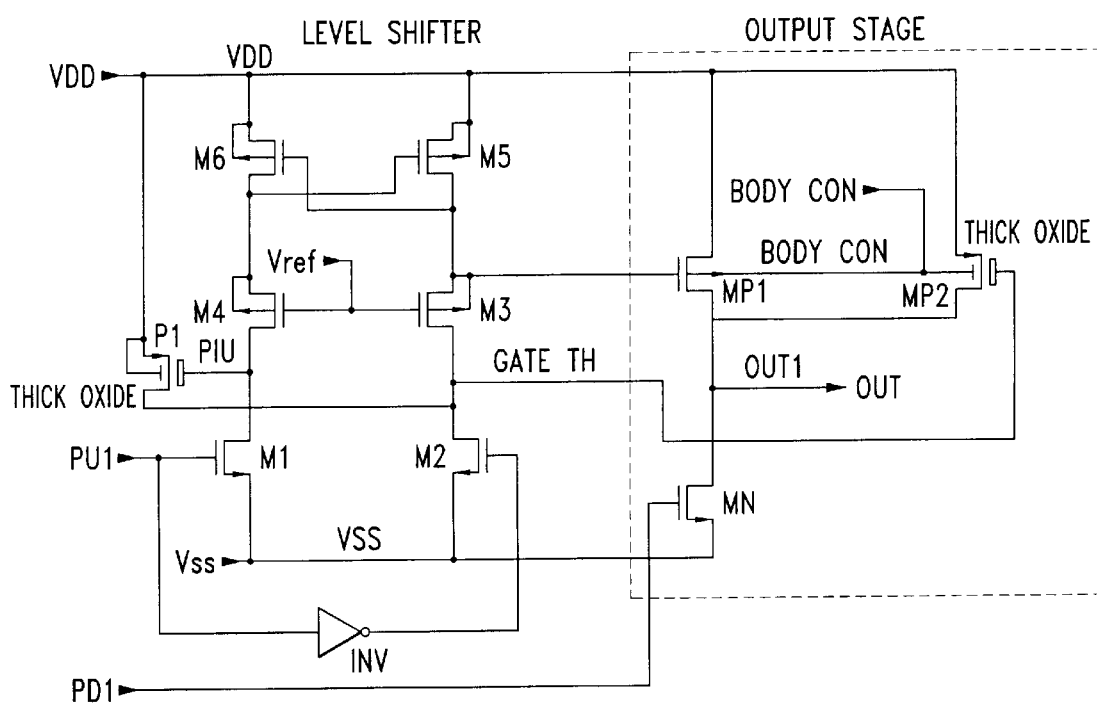
FIG. 4 is a schematic view of an output stage and its associated driver circuit according to this invention.

FIG. 4 shows in greater detail the internal construction of the driver circuit 5, which comprises a shifter circuit stage equipped with a differential cell level shifter comprising a pair of DMOS input transistors M1 and M2. An input signal PU1 is applied to the transistor M1 directly and in inverted form to the transistor M2 via an inverter INV.

The differential cell of the circuit 5 has on its output a pair of PMOS transistors M3 and M4 having their respective gate terminals connected to a reference at a voltage Vref.

The source terminal of the transistor M3 forms the first output A of the circuit 5 connected to the gate terminal of the output stage transistor MP1.

An additional pair of cross-coupled NMOS transistors M5 and M6 connect the PMOS transistor pair to the supply voltage reference Vdd.

The first transistor M4 in the PMOS pair is connected in series with the input transistor M1 and forms a complementary pair therewith. The transistor M4 has its drain terminal connected to the drain of the NMOS transistor M1 and the gate terminal of an additional transistor P1, the latter being a thick oxide PMOS transistor.

The source terminal of the power transistor P1 is connected to the first supply reference Vdd, and the drain terminal of the transistor P1 is connected to the drain terminal of the second input transistor M2.

The transistor P1 has its body terminal connected to the source terminal.

Advantageously, the drain terminal of the second NMOS input transistor M2 forms the second output B of the driver circuit 5, i.e., the output connected to the gate terminal of the power transistor MP2 in the final stage whereat a signal GATE-TH is produced.

The structure described above is but a non-limitative example illustrating a possible application. This structure is not a binding one for the invention operation.

In particular, the power transistor P1 is not essential to the invention, but may be useful for charging the output B rapidly.

The operation of the final stage according to the invention will now be described by first considering its direct mode of operation, that is with current flowing from the source to the drain of the thin oxide PMOS transistor MP1.

For a given size, the transistor MP1 can conduct a larger current. However, if the so-called body effect is utilized by biasing the common body well to a higher potential than the source, this effect has a significant impact on the performance of the transistor MP1.

Due to a gate overvoltage, the current conduction rate of the other thick oxide PMOS transistor MP2 is reduced in a less significant way.

This reduction is also apparent in reverse operation, that is with the current flowing from the drain terminal to the source terminal, when the drain and source terminals exchange their functions. This is only possible if the body terminal is unconnected to the source terminal.

A secondary effect appearing in reverse operation should also be noted.

For voltage retention reasons, lightly doped, and therefore fairly resistive, regions are diffused in the drain region. When the drain terminal functions essentially as a source terminal, the voltage drop across this resistance has the same consequences as a body effect, because the drain terminal no longer represents the true drain and a local actual drain must be considered whose voltage potential is the higher the larger the current being flowed.

Figure 3:
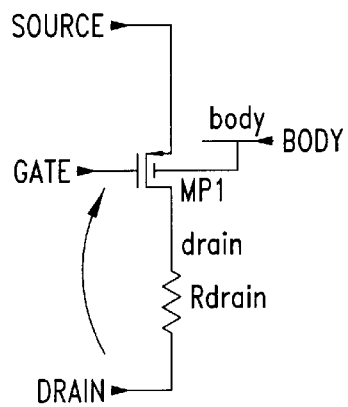
FIG. 3 is a schematic view of a particular component of the final stage shown in FIG. 2.

An attempt has been made to depict this secondary effect in FIG. 3 which shows schematically the existence of a resistance Rdrain within the drain region.

This secondary effect produces a negative feedback which lowers the gate overvoltage (Vdg−|Vth|), thereby limiting the current I.

Here again, the thick oxide PMOS transistor MP2 is almost immune or at least less responsive to this effect, because its drain-source voltage drop Vdg>>Vth.

To summarize, it can be said that the two PMOS transistors in the final output stage are coupled according to the invention to make best use of the characteristics of each of them and, therefore, they can conduct the largest possible number of charge carriers in either direction of current flow, from the supply to the load and back, for the same occupied area.

The high-voltage output stage of this invention has a major advantage in that it uses two PMOS power transistors laid in parallel to share the same body well.

Both transistors can withstand high voltages, and the second MP2 of them can sustain high gate voltages because it is formed by growing a gate oxide to a larger-than-normal thickness, such that it can be regarded as belonging to the thick oxide type.

This construction blends the advantages of both thick field oxide and thin gate oxide devices, especially in those circuit structures where the body terminal is kept unconnected to the source terminal.

What is claimed is:

1. A high-voltage final output stage for driving an electric load, comprising
   a complementary pair of transistors connected between first and second supply voltage references, and including a PMOS pull-up transistor connected to an NMOS pull-down transistor; and
   a thick-oxide PMOS power transistor connected in parallel with the pull-up transistor and shares a body terminal in common therewith.

2. An output stage according to claim 1, wherein the body terminals of both PMOS transistors are formed in the semiconductor within a common well adapted to withstand high voltages.

3. An output stage according to claim 1, further comprising a level shifter circuit having a first output connected to the control terminal of the pull-up transistor and a second output connected to the control terminal of said additional transistor.

4. An output stage according to claim 1, wherein the drain terminals of both PMOS transistors are connected to a common output node of the stage.

5. An output stage according to claim 1, wherein said body terminal is applied a predetermined value potential.

6. A driver circuit for driving an electric load, comprising:
a level shifter having first and second outputs; and
a high-voltage output stage having a complementary pair of transistors connected between first and second supply voltage references, the complementary pair including a pull-up first transistor connected to a pull-down second transistor at an output node, the output stage also including a third transistor connected in parallel with the second transistor between the first supply voltage reference and the output node, the second transistor having a control terminal coupled to the first output of the level shifter and the third transistor having a control terminal coupled to the second output of the level shifter, the second and third transistors sharing a body terminal in common with each other, wherein the second transistor is a thin oxide PMOS power transistor and the third transistor is a thick oxide PMOS power transistor.

7. The output stage of claim 6 wherein the body terminal of second and third transistor is formed in the semiconductor within a common well adapted to withstand high voltages.

8. The output stage of claim 6 wherein the first transistor is an NMOS transistor and the second and third transistors are PMOS transistors.

9. The output stage of claim 6 wherein the body terminal is coupled to a bias line of a predetermined potential.

10. The output stage of claim 6 wherein the level shifter includes a logical input to which each of the level shifter outputs is responsive.

11. The driver circuit of claim 7 wherein the level shifter includes a first input transistor and a first buffer transistor, the first input transistor having a control terminal coupled to the logical input, a first terminal coupled to the second supply voltage reference, and a second terminal, and the first buffer transistor includes a first terminal coupled to the second terminal of the first input transistor and to the level shifter second output and a second terminal coupled to the level shifter first output.

12. The driver circuit of claim 11 wherein the level shifter includes a second input transistor and a second buffer transistor; the second input transistor having a control terminal coupled to the logical input and to the control terminal of the second input transistor via an inverter, a first terminal coupled to the second supply voltage reference, and a second terminal; and the second buffer transistor having a control terminal coupled to the control terminal of the first buffer transistor, a first terminal coupled to the second terminal of the second input transistor, and a second terminal coupled to the first supply voltage reference.

13. The driver circuit of claim 12 wherein the level shifter includes a bistable flip-flop that includes first and second flip-flop transistors having respective first terminals coupled respectively to the second terminals of the first and second buffer transistors, respective second terminals coupled to the first supply voltage reference, and respective control terminals coupled to each other and to a bias voltage.

14. The driver circuit of claim 12 wherein the level shifter includes a power transistor having a first terminal coupled to the first supply voltage reference, a second terminal coupled to the second output, and a control terminal coupled to the second terminal of the second input transistor.

15. A method of driving an electrical load, comprising:
providing an output stage with first and second output transistors connected in parallel between a first supply voltage reference and an output node and having a shared body terminal in common with each other, the first output transistor being a thin oxide MOS transistor and the second output transistor being a thick oxide MOS transistor; and
biasing the shared body terminal to a higher voltage than the first supply voltage reference, thereby reducing a current conduction rate of the first output transistor to a greater degree than a current conduction rate of the second output transistor is reduced.

16. A method of driving a load using a high-voltage output stage having first and second output transistors connected in parallel between a first supply voltage reference and an output node, each output transistor having a control terminal, the first output transistor being a thin-oxide MOS transistor and the second output transistor being a thick-oxide MOS transistor, the method comprising:
receiving a first logical input signal;
producing a level shifted first output signal in response to the first logical input signal;
producing a level shifted second output signal in response to the first logical input signal;
driving the control terminal of the first output transistor with the first output signal; and
driving the control terminal of the second output transistor with the second output signal.

17. The method of claim 16 wherein the act of producing the first output signal includes turning on a first power switch to electrically connect the control terminal of the first output transistor to the first supply voltage reference and the act of producing the second output signal includes turning on a second power switch to electrically connect the control terminal of the second output transistor to the first supply voltage reference.

18. The method of claim 17 wherein the acts of turning on the first and second power switches includes turning on an input switch to electrically connect control terminals of the first and second power switches to a second supply voltage reference.

19. The method of claim 16 wherein the act of producing the first output signal includes turning on a first input switch to electrically connect the control terminal of the first output transistor to a second supply voltage reference and the act of producing the second output signal includes turning on a second input switch to electrically connect the control terminal of the second output transistor to the second supply voltage reference.

20. The method of claim 19, further comprising:
providing a first power switch connected between the first input switch and the first supply voltage reference, and a second power switch connected between the second input switch and the first supply voltage reference; and
turning on a control switch in response to the first logical signal being at a first state, the turned on control switch maintaining both of the first and second power switches in an off condition.

* * * * *